(12) United States Patent
MacQuarrie et al.

(10) Patent No.: US 7,737,550 B2
(45) Date of Patent: Jun. 15, 2010

(54) OPTIMIZATION OF ELECTRONIC PACKAGE GEOMETRY FOR THERMAL DISSIPATION

(75) Inventors: Stephen W. MacQuarrie, Vestal, NY (US); Scott P. Moore, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 11/847,716

(22) Filed: Aug. 30, 2007

(65) Prior Publication Data

US 2009/0059537 A1 Mar. 5, 2009

(51) Int. Cl.
*H01L 23/43* (2006.01)
*H01L 21/00* (2006.01)

(52) U.S. Cl. .................................. 257/712; 438/122
(58) Field of Classification Search .................. None
See application file for complete search history.

(56) References Cited

U.S. PATENT DOCUMENTS

| 7,338,818 | B2 * | 3/2008 | Arroyo et al. ................. 438/14 |
| 2004/0217467 | A1 * | 11/2004 | Rumer et al. ................ 257/718 |
| 2005/0139998 | A1 * | 6/2005 | Fitzgerald et al. ........... 257/713 |
| 2006/0292840 | A1 * | 12/2006 | Lin et al. ..................... 438/584 |

FOREIGN PATENT DOCUMENTS

| JP | 11163231 A | 6/1999 |
| JP | 11317478 A | 11/1999 |
| JP | 2004-4327987 A | 11/2004 |

* cited by examiner

*Primary Examiner*—Scott B Geyer
(74) *Attorney, Agent, or Firm*—Scully, Scott, Murphy & Presser, P.C.; Carl Lanuti, Esq.

(57) ABSTRACT

An electronic package device is disclosed including a microelectronic package and a heat sink positioned over the microelectronic package. A thermal interface element is positioned between the microelectronic package and the heat sink. The thermal interface element is elongated and has differing thicknesses along its length to enhance the dissipation of heat.

10 Claims, 2 Drawing Sheets

OPTIMIZATION OF ELECTRONIC PACKAGE GEOMETRY FOR THERMAL DISSIPATION

FIELD OF THE INVENTION

The present invention relates to a thermal interface element for an electronic package device, and more particularly, to a thermal interface element for conducting heat between a microelectronic package and a heat sink.

BACKGROUND OF THE INVENTION

Typical microelectronic or microprocessor packages have an undesirable thermal resistance between the package and an adjacent heat sink. A cause of this high thermal resistance is a thermal interface material which forms a layer having a thickness over the lid or cover of a housing containing the microprocessor die. The lid housing the microprocessor is typically flat, and the layer of interface material between the lid and the heat sick conforms to the surface of the lid and is therefore of a substantially uniform thickness.

It would therefore be desirable to enhance thermal conduction between a heat sink and microprocessor package. It would also be desirable to enhance thermal conduction without unduly structurally burdening the microprocessor package, and in a cost efficient manner.

SUMMARY OF THE INVENTION

In an aspect of the present invention, an electronic package device includes a microelectronic package, a heat sink positioned over the microelectronic package, and a thermal interface element for dissipating heat. The thermal interface element is elongated and has differing thicknesses along a length, and the thermal interface element is positioned between the microelectronic package and the heat sink.

In a related aspect, the thermal interface element is substantially concave.

In a related aspect, the thermal interface element is substantially concave and conforming to a convex top surface of the microelectronic package.

In a related aspect, the thermal interface element includes a middle region having a first thickness along a specified length of the element.

In a related aspect, the thermal interface element includes a middle region having a first thickness along a first specified length of the element, and two end regions substantially continuous with the middle region each having a second thickness along second specified lengths of the element.

In a related aspect, the first specified length of the element has a first thickness that is less than a second thickness of the second specified lengths of the element.

In a related aspect, the microelectronic package includes a lid having a convex top surface and a flat bottom surface and the top surface is adjacent to and mates with the thermal interface element to provide a concavely shaped thermal interface element.

In a related aspect, the thermal interface element is a liquid, film, paste or a gel which is secured to the microelectronic package and the heat sink by heat or pressure or a combination of both.

In a related aspect, the microelectronic package includes at least one chip positioned in a cavity defined by the lid and chip carrier, the microelectronic package positioned over solder balls connected to a top surface of a circuit board.

In a related aspect, the device further includes a thermal interface material (TIM) positioned over the at least one chip and contacting an underside of the lid.

In a related aspect, the package further may include a plurality of chips.

In a related aspect, the microelectronic package includes a lid having a convex top surface and a convex bottom surface. The top surface is adjacent to and mates with a first thermal interface element to provide a concavely shaped first thermal interface element. A second thermal interface element is positioned between the convexly shaped bottom surface of the lid and a chip or die within the microelectronic package to provide a concavely shaped second thermal interface element for dissipating heat.

In another aspect of the invention, an electronic package device includes a microelectronic package including a lid having a convex bottom surface and a chip or die within the package. A heat sink is positioned over the lid of the microelectronic package. A thermal interface element for dissipating heat is elongated and has differing thicknesses along a length. The thermal interface element is positioned between the convexly shaped bottom surface of the lid and the chip or die to provide the thermal interface element with a concave shape for dissipating heat.

In another aspect, a method for dissipating heat in an electronic package includes providing a microelectronic package; positioning a heat sink over the microelectronic package; positioning a thermal interface element between the microelectronic package and the heat sink for dissipating heat from the microelectronic package; and shaping a mating surface area of the microelectronic package to provide a varying thickness along a length of the thermal interface element.

BRIEF DESCRIPTION OF THE DRAWINGS

These and other objects, features and advantages of the present invention will become apparent from the following detailed description of illustrative embodiments thereof, which is to be read in connection with the accompanying drawing, in which.

DETAILED DESCRIPTION OF THE INVENTION

Figure 1:
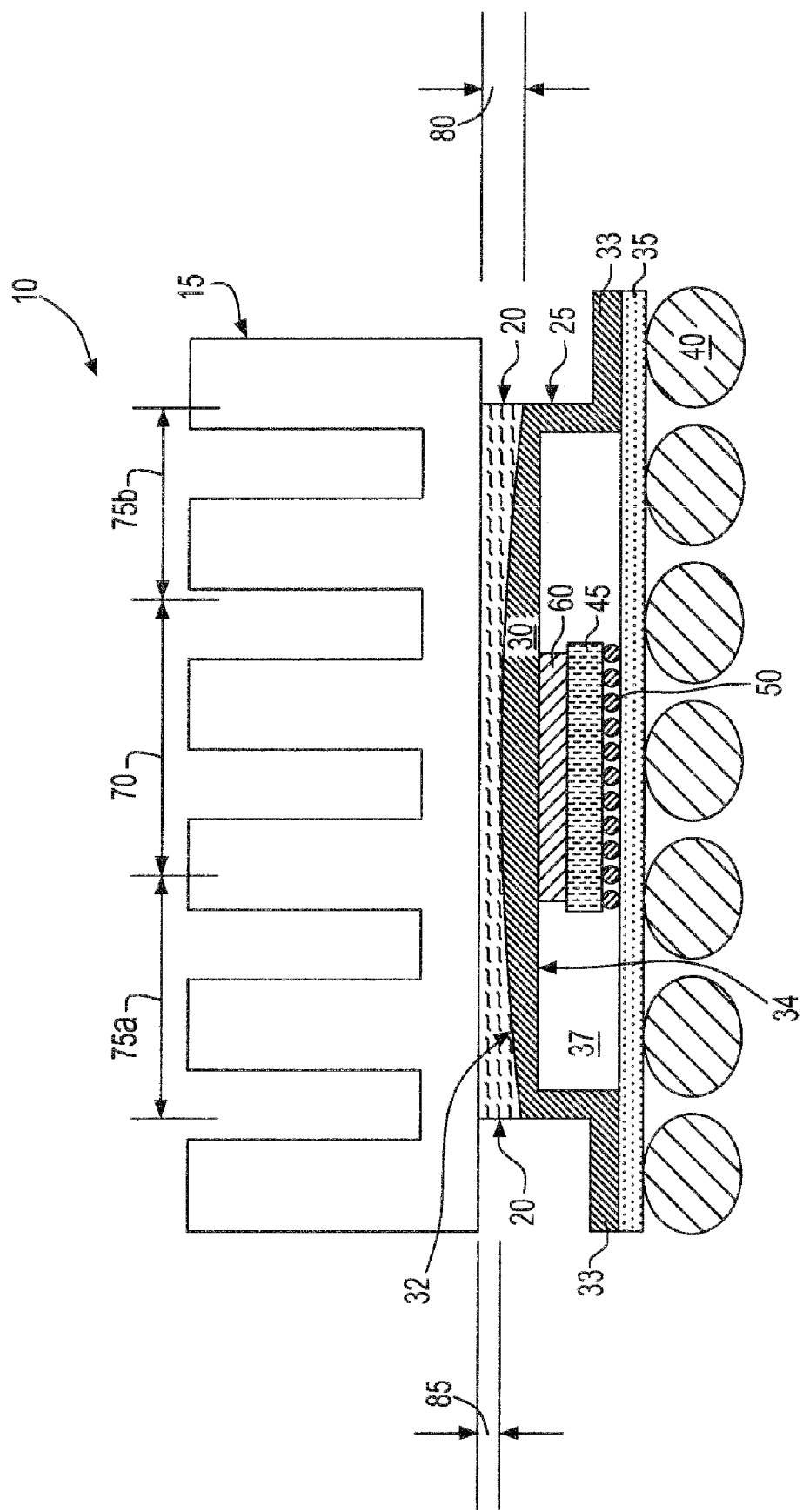
FIG. 1 is a cross sectional side elevational view of a concavely shaped thermal interface element between a lid of a microelectronic package having a convex top surface and a heat sink according to the invention.

According to the present invention, an illustrative embodiment of an electronic package 10 is shown in the FIG. 1. The electronic package 10 includes a heat sink 15 positioned over a microelectronic package 25 with a thermal interface element 20 therebetween. The microelectronic package 25 includes a lid 30 having a convex top surface 32 and a flat bottom surface 34. The top surface 32 is adjacent to and mates with the thermal interface element 20 between the heat sink 15 and the top surface 32 of the lid 30. The thermal interface element 20 is shaped concavely when conforming to the convex shape of the top surface 32 of the lid 30. The microelectronic package 25 further includes the lid 30 attaching to a chip carrier 35 using feet 33. The chip carrier 35 is electrically connected to solder balls 40 beneath the chip carrier 35. The lid 30 and chip carrier 35 combination define a cavity 37 therebetween.

Typically the lid 30 of the semiconductor package 25 is of metal or of another rigid material. The thermal interface structure 20 may be, for example, any substance which is flexible, compressible and provides for thermal heat transfer. The thermal interface structure 20 can be, for example, a liquid, film, paste or a gel which is secured to the microelectronic package and the heat sink by heat or pressure or a combination of both. The thermal interface element 20 may also be, for example, an adhesive which may be in liquid form, and which may also cure at room temperature or require heat, and singularly or in combination compression.

The microelectronic package 25 further includes at least one chip 45 positioned in the cavity 37 on top of solder balls 50 which are connected to a top surface of the chip carrier 35. A thermal interface material (TIM) 60 is positioned over the chip 45 and in adjacent contact with the lid 30. In another embodiment, the chip 45 may be replaced with multiple chips.

Further, the thermal interface element 20 has a thickness which varies in relation to the convex shape of the top surface 32 of the lid 30. A middle region 70 of the element 20 has a first thickness 85 which is thinner than end regions 75a, 75b which have a thickness 80. The end regions 75a, 75b thus have a second thickness 80 which is greater than the thickness 85 in the middle region 70. Other geometric shapes of the element 20 would result in variable thicknesses at different regions along the length of the element and may also be used to enhance thermal conductivity.

Referring to FIG. 1, the thickness 85 of the thermal interface structure 20 is mineralized by using the convex shaped top surface 32 of the lid 30. The thermal interface structure 20 is thermally conductive and conforms to the convex top surface 32 of the lid 30 to form the thin region 70 of the thermal interface structure 20. Thus, the thin region 70 provides an enhanced heat transfer region. Thereby, the present invention reduces thermal resistance between the package 25 and the heat sink 15. The enhanced heat transfer allows the microprocessor 45, and thereby the microelectronic package 25, to operate at a cooler temperature.

Figure 2:
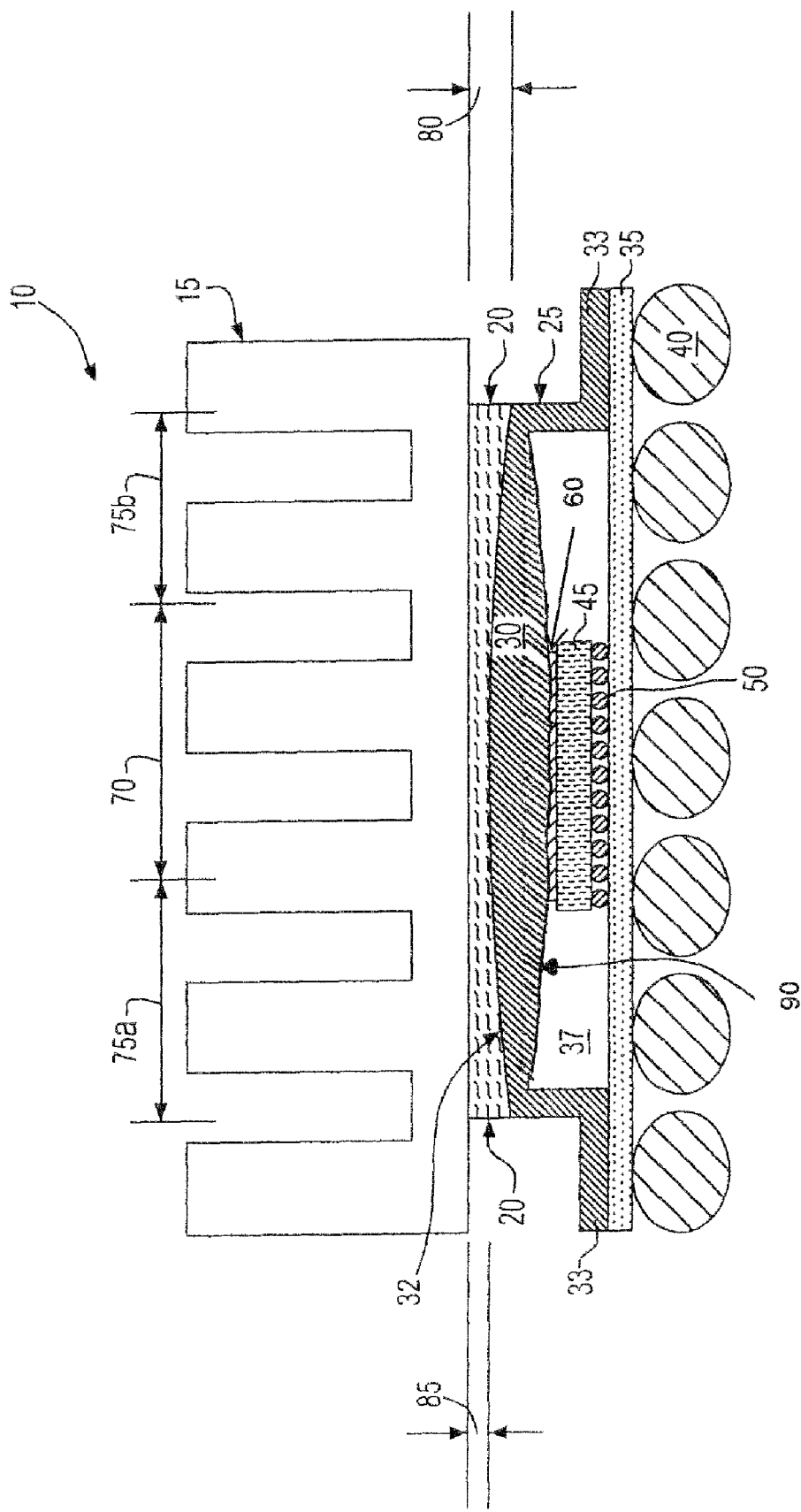
FIG. 2 is a cross sectional side elevational view of a package according to another embodiment of the invention including a lid having convex top and bottom surfaces.

In an alternative embodiment depicted in FIG. 2, a bottom surface 90 of the lid 30 is shaped convexly in relation to the thermal interface material (TIM) 60 above the chip 45. Thermally conductive material between the heat sink 60 and a convexly shaped inner side of the cover is thinner than a flat layer of conductive material similar to the conductive layer between the convex lid 30 cover and the heat sink 15 shown in the FIG. 1. Thus, the thinner thermally conductive material enhances thermal conductivity between the cover 30 and the thermal interface material (TIM) 60 above the chip 45.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A electronic package device, comprising:
   a microelectronic package;
   a heat sink positioned over the microelectronic package; and
   a thermal interface element for dissipating heat, the thermal interface element being elongated and having differing thicknesses along a length, and the thermal interface element being positioned between the microelectronic package and the heat sink; and
   a lid positioned over the microelectronic package, the lid including a convex top surface and a convex bottom surface;
   a first thermal interface element positioned between and mating with the convex top surface of the lid and the heat sink to provide a concavely shaped first thermal interface element for dissipating heat; and
   a second thermal interface element positioned between the convex bottom surface of the lid and a chip within the microelectronic package to provide a concavely shaped second thermal interface element for dissipating heat.

2. The device of claim 1, wherein the thermal interface element includes a middle region having a first thickness along a specified length of the element.

3. The device of claim 1, wherein the thermal interface element includes a middle region having a first thickness along a first specified length of the element, and two end regions substantially continuous with the middle region each having a second thickness along second specified lengths of the element.

4. The device of claim 3, wherein the first specified length of the element has a first thickness that is less than a second thickness of the second specified lengths of the element.

5. The device of claim 1, wherein the microelectronic package includes a lid having a convex top surface and a flat bottom surface and the top surface is adjacent to and mates with the thermal interface element to provide a concavely shaped thermal interface element.

6. The device of claim 1, wherein the thermal interface element is a liquid, film, paste or a gel which is secured to the microelectronic package and the heat sink by heat or pressure or a combination of both.

7. The device of claim 1, wherein the microelectronic package includes at least one chip positioned in a cavity defined by the lid and chip carrier, the microelectronic package positioned over solder balls connected to a top surface of a circuit board.

8. The device of claim 7, further including a thermal interface material (TIM) positioned over the at least one chip and contacting an underside of the lid.

9. The device of claim 7, further including a plurality of chips.

10. A method for dissipating heat in an electronic package, comprising:
   providing a microelectronic package;
   positioning a heat sink over the microelectronic package;
   positioning a thermal interface element between the microelectronic package and the heat sink for dissipating heat from the microelectronic package;
   shaping a mating surface area of the microelectronic package to provide a varying thickness along a length of the thermal interface element;
   positioning a lid over the microelectronic package, the lid including a convex top surface and a convex bottom surface;
   layering a first thermal interface element between and mating with the convex top surface of the lid and the heat sink to provide a concavely shaped first thermal interface element for dissipating heat; and
   layering a second thermal interface element between the convex bottom surface of the lid and a chip within the microelectronic package to provide a concavely shaped second thermal interface element for dissipating heat.

* * * * *